United States Patent
Nause et al.

(10) Patent No.: US 7,105,868 B2
(45) Date of Patent: Sep. 12, 2006

(54) HIGH-ELECTRON MOBILITY TRANSISTOR WITH ZINC OXIDE

(75) Inventors: Jeff Nause, Mableton, GA (US); Shanthi Ganesan, Smyrna, GA (US)

(73) Assignee: Cermet, Inc., Atlanta, GA (US)

( * ) Notice: Subject to any disclaimer, the term of this patent is extended or adjusted under 35 U.S.C. 154(b) by 0 days.

(21) Appl. No.: 10/602,982

(22) Filed: Jun. 24, 2003

(65) Prior Publication Data

US 2004/0056273 A1    Mar. 25, 2004

Related U.S. Application Data

(60) Provisional application No. 60/391,519, filed on Jun. 24, 2002.

(51) Int. Cl.
*H01L 31/0328* (2006.01)

(52) U.S. Cl. ............... 257/192; 257/194; 257/410; 257/E29.246

(58) Field of Classification Search ........... 257/194, 257/192, 410, E29.246–E29.253; 438/167, 438/172, 216, 261, 421, 591, 595
See application file for complete search history.

(56) References Cited

U.S. PATENT DOCUMENTS

| | | | | |
|---|---|---|---|---|
| 4,065,781 A | * | 12/1977 | Gutknecht | 257/66 |
| 4,677,457 A | * | 6/1987 | Wolter | 257/194 |
| 5,825,056 A | * | 10/1998 | Yonemoto | 257/290 |
| 5,880,483 A | * | 3/1999 | Shanfield et al. | 257/22 |
| 5,929,467 A | * | 7/1999 | Kawai et al. | 257/192 |
| 6,140,169 A | * | 10/2000 | Kawai et al. | 438/197 |
| 6,323,053 B1 | * | 11/2001 | Nishikawa et al. | 438/46 |
| 6,429,467 B1 | * | 8/2002 | Ando | 257/194 |
| 6,469,315 B1 | * | 10/2002 | Suzuki et al. | 257/20 |
| 6,521,961 B1 | * | 2/2003 | Costa et al. | 257/402 |
| 6,555,850 B1 | * | 4/2003 | Sakamoto et al. | 257/192 |
| 6,586,781 B1 | * | 7/2003 | Wu et al. | 257/194 |
| 6,593,193 B1 | * | 7/2003 | Nishii et al. | 438/285 |
| 6,593,194 B1 | * | 7/2003 | Kolodzey et al. | 438/287 |
| 6,727,522 B1 | * | 4/2004 | Kawasaki et al. | 257/103 |
| 6,838,308 B1 | * | 1/2005 | Haga | 438/104 |
| 6,878,962 B1 | * | 4/2005 | Kawasaki et al. | 257/43 |
| 2002/0109135 A1 | * | 8/2002 | Murota et al. | 257/20 |
| 2002/0139995 A1 | * | 10/2002 | Inoue et al. | 257/194 |
| 2002/0167023 A1 | * | 11/2002 | Chavarkar et al. | 257/194 |
| 2003/0218221 A1 | * | 11/2003 | Wager et al. | 257/410 |

FOREIGN PATENT DOCUMENTS

| | | | |
|---|---|---|---|
| JP | 2000277534 A | * | 10/2000 |
| JP | 2003101011 A | * | 4/2003 |

\* cited by examiner

*Primary Examiner*—Eugene Lee
(74) *Attorney, Agent, or Firm*—Alston & Bird LLP

(57) ABSTRACT

A zinc oxide (ZnO) field effect transistor exhibits large input amplitude by using a gate insulating layer. A channel layer and the gate insulating layer are sequentially laminated on a substrate. A gate electrode is formed on the gate insulating layer. A source contact and a drain contact are disposed at the both sides of the gate contact and are electrically connected to the channel layer via openings. The channel layer is formed from n-type ZnO. The gate insulating layer is made from aluminum nitride/aluminum gallium nitride (AlN/AlGaN) or magnesium zinc oxide (MgZnO), which exhibits excellent insulation characteristics, thus increasing the Schottky barrier and achieving large input amplitude. If the FET is operated in the enhancement mode, it is operable in a manner similar to a silicon metal oxide semiconductor field effect transistor (Si-MOS-type FET), resulting in the formation of an inversion layer.

17 Claims, 2 Drawing Sheets

BAND DIAGRAM SHOWING THE BAND BENDING
AND FORMATION OF 2DEG ELECTRON GAS

HIGH-ELECTRON MOBILITY TRANSISTOR WITH ZINC OXIDE

CROSS-REFERENCE TO RELATED APPLICATION

This patent application is a U.S. nonprovisional application filed pursuant to Title 35, United States Code §§100 et seq. and 37 C.F.R. Section 1.53(b) claiming priority under Title 35, United States Code §119(e) to U.S. provisional application no. 60/391,519 filed Jun. 24, 2002 naming Jeffrey E. Nause and Shanthi Ganesan as inventors. Both the subject application and its provisional application have been or are under obligation to be assigned to the same entity.

BACKGROUND OF THE INVENTION

1. Field of the Invention

The present invention relates to a high electron mobility transistor (HEMT). More particularly, the present invention relates to a HEMT formed as a field effect transistor (FET) having a gate insulating layer positioned between a gate contact and channel layer. The invention also pertains to manufacturing methods for the aforementioned HEMT device.

2. Description of the Related Art

As known to those familiar with semiconductors, materials such as silicon (Si) and gallium arsenide (GaAs) have found wide application in semiconductor devices for lower power and in the case of Si lower frequency applications. These more familiar semiconductor materials have failed to penetrate higher power high frequency applications to the extent desirable, however, because of their relatively small bandgaps (e.g., 1.12 eV for Si and 1.42 eV for GaAs at room temperature) and relatively small breakdown voltages.

Accordingly, interest in high power, high temperature, and high frequency applications and devices has turned to wide bandgap semiconductor materials such as zinc oxide (3.37 eV at room temperature), silicon carbide (SiC) (2.996 eV for alpha SiC at room temperature) and the Group III nitrides such as gallium nitride (GaN) (3.36 eV for GaN at room temperature). These materials have higher electric field breakdown strengths and higher electron saturation velocities as compared to GaAs and Si.

A device of particular interest is the high electron mobility transistor (HEMT), which is also known as a modulation-doped field effect transistor (MODFET). These devices offer operational advantages under a number of circumstances because a two-dimensional electron gas (2DEG) is formed at the heterojunction of two semiconductor materials with different bandgap energies, and where the smaller bandgap material has a higher electron affinity than the larger bandgap material. The 2DEG is an accumulation layer in the undoped, smaller bandgap material and can contain a very high sheet electron concentration on the order of $10^{12}$ to $10^{13}$ carriers per square centimeter (carriers/cm$^2$). Additionally, electrons that originate in the doped, wider-bandgap semiconductor transfer to the 2DEG, allowing a high electron mobility due to reduced ionized impurity scattering.

This combination of high carrier concentration and high carrier mobility gives the HEMT a very large transconductance and a strong performance advantage over metal-semiconductor field effect transistors (MESFETs) for high-frequency applications. High electron mobility transistors fabricated in the zinc oxide/aluminum gallium nitride (ZnO/AlGaN) material system have the potential to generate large amounts of radio-frequency (RF) power because of their unique combination of material characteristics which includes the aforementioned high breakdown fields, their wide bandgaps, large conduction band offset, and high saturated electron drift velocity. A major portion of the electrons in the 2DEG is attributed to pseudomorphic strain in the AlGaN/MgZnO since the MgZnO in-plane lattice parameter is 3% smaller than that of ZnO. When (0001) oriented MgZnO alloys are grown on thick ZnO, the biaxial strain induces a piezoelectric field in the material. When MgZnO layers are grown beyond the critical thickness for the Mg concentration used, the film begins to relax, and if the strain is sufficient, it leads to cracking of the film. This strain is useful however, in that it can be used to create a piezoelectric field in the structure. Bykhovski et. al. proposed using piezoelectric doping for AlGaN/GaN (possible replacement of GaN by ZnO is suggested in the same work) HEMT structures as a substitute for conventional impurity doping. The piezoelectric doping produces a 2-D electron gas (2DEG) near the interface without having to use conventional doping. In order to work, a high quality MgZnO layer is required, because the electron density in the MgZnO/ZnO 2DEG structure is limited by the elastic strain relaxation, which depends on MgZnO barrier thickness and on the Mg molar fraction in the barrier. It is this principle that has allowed the development of ZnO based FETs. Strain diminishes once the barrier thickness is larger than the critical thickness. The development of misfit dislocations in heterostructures can significantly affect the mobility and reduce the device performance. Maeda et al. further discovered in their study that the maximum 2DEG density depends more strongly on the strain relaxation than on the Al composition.

High power semiconducting devices of this type operate in a microwave frequency range and are used for RF communication networks and radar applications and offer the potential to greatly reduce the complexity and thus the cost of cellular phone base station transmitters. Other potential applications for high power microwave semiconductor devices include replacing the relatively costly tubes and transformers in conventional microwave ovens, increasing the lifetime of satellite transmitters, and improving the efficiency of personal communication system base station transmitters. Accordingly, the need exists for continued improvement in high frequency high power semiconductor based microwave devices.

SUMMARY OF THE INVENTION

Accordingly, in view of the above background, the present invention is directed to a ZnO-type FET which obtains large input amplitude by using a chemically stable gate insulating layer. The invention is also directed to methods for manufacturing such FET device.

According to one embodiment of the present invention, there is provided a FET comprising a channel layer composed of ZnO grown homoepitaxially on a semi-insulating ZnO substrate. A gate contact is disposed on the channel layer. A gate insulating layer is disposed between the gate contact and the channel layer and is composed of a Group-III nitride compound semiconductor containing at least aluminum as a Group-III element. Therefore, the present invention can provide a high electron mobility transistor (HEMT) that takes advantage of the electronic properties of Group III nitrides, and that does so in a manner superior to other existing and related devices.

A high electron mobility transistor (HEMT) of the invention can comprise a semi-insulating ZnO substrate, an undoped ZnO channel layer on the substrate, an active structure of aluminum gallium nitride or magnesium zinc oxide on the zinc oxide layer, a passivation layer on the aluminum gallium nitride or magnesium zinc oxide active structure, and respective source, drain and gate contacts to the aluminum gallium nitride or magnesium zinc oxide active structure.

According to the manufacturing method for the above FET, after the gate-insulating-film forming layer is formed on the channel layer, a dummy gate is formed, and the side walls are made on the lateral surfaces of the dummy gate. The gate-insulating-film-forming layer is then selectively removed by using the dummy gate and the sidewalls as a mask, thereby forming a gate insulating layer.

Additional objects and advantages of the invention are set forth in the description which follows. The objects and advantages of the invention may be realized and obtained by means of the instrumentalities and combinations particularly pointed out in the appended claims.

BRIEF DESCRIPTION OF THE DRAWINGS

The accompanying drawings, which are incorporated herein and constitute a part of the specification, illustrate presently preferred embodiments of the invention, and together with the general description given above and the detailed description of the preferred embodiments given below, serve to explain the principles of the invention.

The invention is now described with reference to the accompanying drawings which constitute a part of this disclosure. In the drawings, like numerals are used to refer to like elements throughout the several views.

DETAILED DESCRIPTION OF THE PREFERRED EMBODIMENTS

Figure 1:
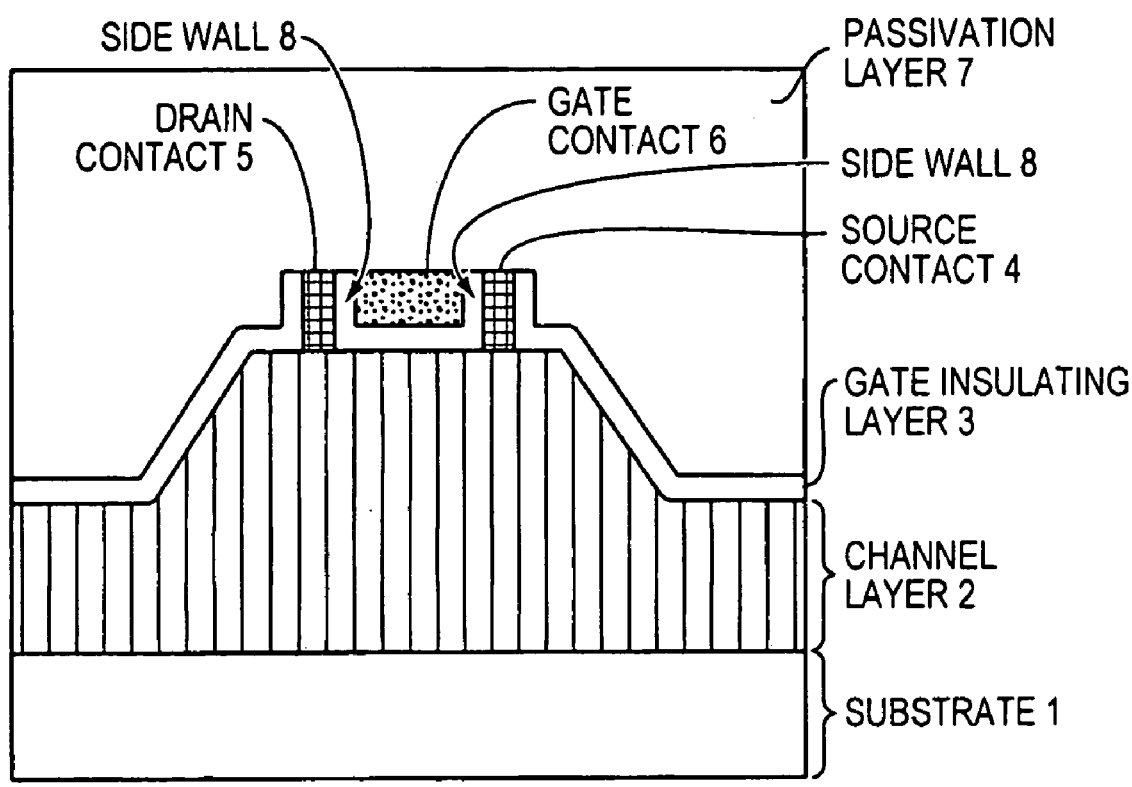
FIG. 1 is a cross-sectional diagrams showing a layer structure of an ZnO/MgZnO HEMT.
Figure 2A:
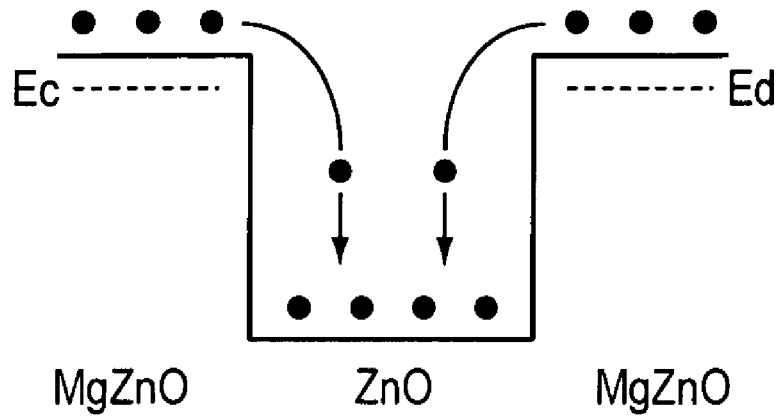
FIGS. 2A and 2B are diagrams showing the band bending and formation of 2DEG electron gas in ZnO/MgZnO hetero junctions.
Figure 2B:
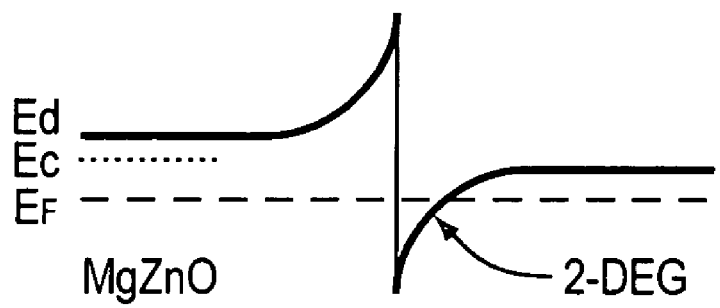

FIG. 1 illustrates the configuration of the HEMT according to the first embodiment of the present invention. In this HEMT, a channel layer 2 and a gate insulating layer 3 are sequentially laminated on a ZnO substrate (for example, a c-surface substrate). Formed on the gate insulating film 3 are a source electrode 4, which is electrically connected to the channel layer 2 via an opening of the gate insulating layer 3. Further, a gate electrode 6 is disposed on the gate insulating layer 3 having side walls 8. The source contact 4, the drain contact 5, and the gate contact 6 are formed by sequentially laminating from the upper surface of the substrate 1. The substrate is formed from high resistance insulating ZnO. The channel layer 2 is made from n-type ZnO doped with an n-type impurity, such as gallium, and has a thickness, for example, 0.1 micrometer. The concentration of the n-type impurity is, for example, $10^{18}$ atoms per cubic centimeter ($cm^3$). The impurity concentration and thickness of channel layer can be controlled to adjust the gate threshold voltage. The gate insulating layer is made from, for example, magnesium zinc oxide (MgZnO), and has a thickness of, for example, three (3) nanometers. The source, drain and gate contacts 4, 5, 6 are covered with a passivation layer 7 as shown in FIG. 1. FIGS. 2A and 2B illustrate the band connecting states between MgZnO and ZnO.

The aluminum gallium nitride (AlGaN) insulation characteristics were previously reported (A. Bykhovski, *J. Appl. Phs.*,77(4),1616(1995)). In this paper replacement of GaN by ZnO is suggested. Furthermore, ZnO has fundamental advantage such as (1) availability of native substrates; (2) wet chemical etching is possible; and (3) more resistance to radiation damage. Also ZnO is easily doped n-type to a high conductivity, can be made semi-insulating, is easily produced in thin film form, and can be grown in high quality, bulk form for homoepitaxial substrates. Homoepitaxial ZnO films with $10^4$ dislocations have already been realized. The mobility of ZnO is lower than GaN because the effective mass is higher, and optical phonon scattering parameter is larger. However, it is interesting that the theoretical saturation velocity $v_s$ which is more important for HEMT devices is higher for ZnO. So the ZnO HEMT disclosed herein is more efficient than other existing devices because of the abovementioned advantages.

The HEMT as described above can be manufactured by the following procedure. The c-ZnO substrate 1 is cleaned at 1050 degrees Celsius in an oxygen atmosphere. Then, the ZnO channel with n-type impurity is grown by using diethyl zinc and oxygen as precursors by metal organic chemical vapor deposition (MOCVD). The temperature is again raised and the insulating MgZnO layer is grown by MOCVD. As material gases, diethyl zinc (DeZn) is used as Zn source. Further, argon is used as a carrier gas. The growing pressure is 10 Torr. A capping layer with a different composition from that of the insulating layer is grown so as to increase the density of electrons in the 2DEG. Because the gate insulating layer 3 is made from MgZnO, which has high insulation characteristics, an adequately high insulation effect can be exhibited even though the thickness of film is decreased. Also the mutual conductance $g_m$ can be increased due to high dielectric constant of MgZnO, therefore making it possible to operate the FET at high speed. Moreover, the gate insulating layer is formed from the MgZnO which has been grown by MOCVD method (i.e., epitaxially grown), a high level of crystallinity can be obtained and relatively low dislocation densities can be achieved.

Thus the HEMT is highly lattice matched and has low defect density MgZnO/ZnO (on a semi-insulating ZnO substrate). Advantages of the device are relatively low defect density, and easy processing. These advantages reflect in better performance characteristics and device reliability.

Although the methods of the invention have been described herein with reference to specific embodiments and examples, it is not necessarily intended to limit the scope of the invention to the specific embodiments and examples disclosed. Thus, in addition to claiming the subject matter literally defined in the appended claims, all modifications, alterations, and equivalents to which the applicant is entitled by law, are herein expressly reserved by the following claims.

What is claimed is:

1. A high electron mobility transistor (HEMT) comprising:
    a channel layer being composed of a II-VI compound semiconductor zinc oxide (ZnO);
    a gate contact disposed in proximity to, but not in contact with, said channel layer; and
    a gate insulating layer disposed between and in contact with said gate contact and said channel layer and composed of at least one of a Group-III nitride compound semiconductor and a magnesium zinc oxide (MgZnO) quantum well structure, said gate insulating layer having side walls, said gate contact positioned between the sidewalls of said gate insulating layer so that sides of said gate contact face the side walls of said gate insulating layer.

2. A HEMT according to claim 1 wherein said gate insulating layer is composed of at least one of an epitaxially grown Group-III nitride compound semiconductor and a MgZnO quantum well structure.

3. A HEMT according to claim 2 wherein said channel layer is composed of an epitaxially grown Group-II-VI zinc oxide compound semiconductor.

4. A HEMT according to claim 1 wherein said gate insulating layer is composed of a Group-III compound semiconductor expressed by a chemical formula $Al_xGa_{1-x}N$ ($0.3 < x \leq 1$) or $Mg_xZn_{1-x}O$ ($0.1 < x < 0.4$).

5. A HEMT according to claim 1 wherein said channel layer is formed on a substrate comprising at least one of zinc oxide (ZnO), silicon carbide (SiC), sapphire ($Al_2O_3$), and silicon (Si) and has a bulk resistivity higher than $10^5$ ohm-centimeter ($\Omega$-cm).

6. A HEMT according to claim 1 wherein the thickness of said gate insulating layer ranges from 0.30 nanometer (nm) to 50 nm.

7. A HEMT according to claim 1 wherein said HEMT employs piezoelectric doping created by strain due to lattice mismatch between the channel layer and the gate insulating layer that produces a two-dimensional electron gas (2DEG) near an interface between the channel layer and the gate insulating layer to avoid usage of a conventional doping method.

8. A HEMT according to claim 1 wherein said gate contact is selected from the group consisting of titanium (Ti), platinum (Pt), silver (Ag), gold (Au), chromium (Cr), alloys of titanium(Ti) and tungsten (W), and platinum silicide (PtSi).

9. A HEMT according to claim 1 wherein source and drain contacts to said channel layer comprise an alloy of titanium (Ti), silicon (Si), aluminum (Al) and nickel (Ni).

10. A HEMT according to claim 1 and further comprising a passivation layer on said gate contact and said source and drain contacts to said channel layer.

11. A HEMT according to claim 1 wherein an area of said gate contact with said gate insulating layer is decreased due to the presence of said sidewalls.

12. A HEMT according to claim 1 wherein the channel layer is composed of ZnO and is grown by metal organic chemical vapor deposition (MOCVD).

13. A HEMT according to claim 1 wherein gate insulating layer is grown by metal organic chemical vapor deposition (MOCVD) and sequentially laminated on said channel layer, the HEMT further comprising:

a substrate composed of ZnO, the channel layer laminated onto the substrate.

14. A HEMT according to claim 13 wherein the substrate is a c-surface substrate.

15. A method comprising the steps of:

defining a channel layer composed of a II-VI compound semiconductor zinc oxide (ZnO);

forming a gate insulating layer in contact with said channel layer and composed of at least one of a Group-III nitride compound semiconductor and a magnesium zinc oxide (MgZnO) quantum well structure, said gate insulating layer formed with side walls; and forming a gate contact disposed on and in contact with said gate insulating layer and positioned between said side walls, said gate contact formed to have sides facing said side walls of said gate insulating layer, said gate contact formed in proximity to, but not in contact with, said channel layer.

16. A method according to claim 15 wherein the gate insulating layer is formed by metal organic chemical vapor deposition (MOCVD).

17. A method according to claim 15 wherein the channel layer is formed on a c-surface ZnO substrate.

* * * * *

UNITED STATES PATENT AND TRADEMARK OFFICE
CERTIFICATE OF CORRECTION

PATENT NO. : 7,105,868 B2
APPLICATION NO. : 10/602982
DATED : September 12, 2006
INVENTOR(S) : Nause et al.

It is certified that error appears in the above-identified patent and that said Letters Patent is hereby corrected as shown below:

Column 5,

Line 14, "$\leqq$" should read --$\leq$--.

Signed and Sealed this

Twelfth Day of June, 2007

JON W. DUDAS
*Director of the United States Patent and Trademark Office*